United States Patent [19]
Peek et al.

[11] Patent Number: 6,054,336
[45] Date of Patent: Apr. 25, 2000

[54] METHOD OF MANUFACTURING AN ELECTRONIC DEVICE

[75] Inventors: Hermanus L. Peek; Daniel W. E. Verbugt, both of Eindhoven, Netherlands

[73] Assignee: U.S. Philips Corporation, New York, N.Y.

[21] Appl. No.: 09/085,085

[22] Filed: May 26, 1998

[30] Foreign Application Priority Data

May 29, 1997 [EP] European Pat. Off. ............ 97201585

[51] Int. Cl.⁷ .................................................. H01L 21/00
[52] U.S. Cl. ................................. 438/60; 438/75; 438/61
[58] Field of Search ................................ 438/60, 61, 48, 438/75, 74

[56] References Cited

U.S. PATENT DOCUMENTS

| | | | |
|---|---|---|---|
| 5,589,407 | 12/1996 | Meyyappan et al. | 438/766 |
| 5,627,096 | 5/1997 | Keigo . | |
| 5,700,712 | 12/1997 | Schwalke . | |
| 5,811,315 | 9/1998 | Yindeepol et al. | 438/405 |
| 5,818,085 | 10/1998 | Hsu et al. | 257/347 |
| 5,854,120 | 12/1998 | Urano et al. | 438/404 |
| 5,883,396 | 3/1999 | Reedy et al. | 257/9 |
| 5,914,280 | 6/1999 | Gelzinis | 438/734 |

OTHER PUBLICATIONS

"A Single–Layer Metal–Electrode CCD Image Sensor" by Nakamura et al, Digest of Technical Papers, 1995 IEEE International Solid–State Circuits Conference PPS. 222–223.

Primary Examiner—Charles Bowers
Assistant Examiner—Scott J. Hawranek
Attorney, Agent, or Firm—Brian J. Wieghaus

[57] ABSTRACT

It may be necessary to provide conductors at very small distances from one another when electronic circuits, for example integrated circuits, are manufactured on an insulating substrate. A multilayer wiring system is often used in that case. The invention renders it possible to make very small inter-electrode gaps in a single conductor layer. To achieve this, the conductor layer is covered with a comparatively thick dielectric layer 4, 5 in which windows 8 are formed which extend over only part of the dielectric layer. Then an auxiliary layer 9 is provided which has depressions at the areas of the windows 8. Windows 11 are formed in the dielectric layer by anisotropic etching-back with dimensions which are substantially smaller than the dimensions of the original windows 8. The windows 11 may be used as etching windows or oxidation windows for the subsequent formation of the definitive conductor pattern.

11 Claims, 3 Drawing Sheets

METHOD OF MANUFACTURING AN ELECTRONIC DEVICE

BACKGROUND OF THE INVENTION

The invention relates to a method of manufacturing an electronic device whereby a conductive layer is provided on an electrically insulating substrate, from which layer a conductor pattern is formed by means of a mask comprising a dielectric layer in which said pattern is defined by openings which were formed in the dielectric layer by means of lithography, which dielectric layer at the areas of the windows to be formed is provided with auxiliary windows having dimensions which are greater, at least in one direction, than the dimensions of the windows to be formed, whereupon an additional dielectric layer is provided which is etched back anisotropically without a mask such that of the additional layer spacers remain behind on side walls of the auxiliary windows. The invention is of particular importance for monolithically integrated circuits. In addition, however, the invention may also be of importance for other devices in which electrical conductors are provided at very small distances from one another, as will become clear from the description, such as, for example, PCBs, or control matrices for LCDs.

Such a method is known, for example, from the article "A Single-Layer Metal-Electrode CCD Image Sensor" by Nakamura et al., published in the Digest of technical papers of the 1995 IEEE International Solid-State Circuits Conference, pp. 222–223. In this known method, which is used for the manufacture of gates of a CCD, the conductor layer is formed by a WSi layer which is covered with a silicon oxide layer in which a mask is formed for patterning the WSi layer. Auxiliary windows are provided in the oxide layer at the areas of the gaps between the gates to be formed for this purpose, the dimensions of the auxiliary windows being greater than those of the gaps to be eventually obtained. The oxide layer is etched throughout its entire thickness, so that the WSi layer lies exposed in the auxiliary windows. The mask windows of reduced dimensions are obtained through the application of spacers on the side walls of the auxiliary windows.

In the method described here, the silicon oxide layer is etched down to the gates to be formed. This may give rise to problems if the etching selectivity between silicon oxide and the conductor material is not sufficiently great, because in that case the gate material will also be attacked. It is of major importance that the material of the gates should not or at least substantially not be made locally thinner owing to the etching of the silicon oxide layer, especially in cases where the conductor layer is very thin, for example comprises a layer of 60 nm thick polycrystalline silicon (poly) in view of the envisaged photosensitivity of the CCD imager.

The invention accordingly has for its object inter alia to modify a method of the kind mentioned in the opening paragraph in such a manner that the conductor material of the gates is not or substantially not attacked by the etchant for the silicon oxide layer.

A further problem which often arises, at least with the use of polycrystalline silicon as the conductor material, while the gates are formed through etching of poly, is that short-circuits of more or less high-ohmic values occur between the gates after etching of the poly, probably as a result of material remaining behind in the gaps after etching. The invention accordingly has for its further object to provide a method whereby such short-circuits can be prevented while very narrow gaps between the conductor tracks are retained.

SUMMARY OF THE INVENTION

According to the invention, a method of the kind mentioned in the opening paragraph is for this purpose characterized in that the auxiliary windows are provided through only part of the thickness of the dielectric layer, and in that etching of the dielectric layer is continued, after the anisotropic etching-back of the additional layer, until the dielectric layer has been locally removed throughout its entire thickness at the areas of the auxiliary windows, whereupon the conductor pattern is formed in the conductive layer through the windows thus formed in the dielectric layer.

The fact that the spacers are provided on the side walls of the auxiliary windows in a stage in which the conductive layer is still entirely covered by the dielectric layer, in accordance with the invention, means that at most those portions of the conductive layer which are situated at the areas of the gaps to be formed, i.e. which will be removed anyway, are exposed to the etching treatment the moment the etching has progressed so far that the conductive layer is reached.

A layer of a suitable metal or of a conductive metal compound, for example a metal silicide, may be used as the conductive layer. In an embodiment of a method according to the invention which is important on account of the use of polycrystalline or amorphous silicon in the manufacture of integrated circuits, the conductive layer is provided in the form of a layer comprising silicon.

A further major embodiment of a method according to the invention is characterized in that the dielectric layer is provided as a dual layer comprising a sub-layer formed by a silicon nitride layer and a sub-layer of silicon oxide which is separated from the conductive layer by the nitride layer. The use of the nitride, which forms an oxidation mask, renders it possible to carry out an oxidation step in the gaps between the conductor tracks, whereby undesirable short-circuits between the conductor tracks are prevented.

After the windows have been formed in the dielectric layer, a corresponding pattern of openings may be advantageously provided in the conductive layer by etching, whereupon the exposed side walls of the conductor tracks can be oxidized by means of said oxidation step. A preferred embodiment, in which a further reduction of the gaps between the conductor tracks can be obtained, is characterized in that the silicon oxide sub-layer is provided to a thickness which is greater than the thickness of the silicon oxide layer which forms said mask, whereupon said layer is provided with auxiliary windows which extend over only part of the silicon oxide layer at the areas of the windows to be formed, whereupon the additional layer also comprising silicon oxide is provided. Such a method is particularly advantageous for conductive layers having a small or very small thickness, for example a thickness of at most 0.1 μm. To reduce oxidation of the conductor tracks in lateral direction as much as possible, preferably, the oxidation is carried out in an oxidizing environment containing water vapor.

BRIEF DESCRIPTION OF THE DRAWINGS

These and other aspects of the invention will be explained in more detail with reference to a few embodiments. In the drawing.

DESCRIPTION OF THE PREFERRED EMBODIMENTS

Figure 1A:
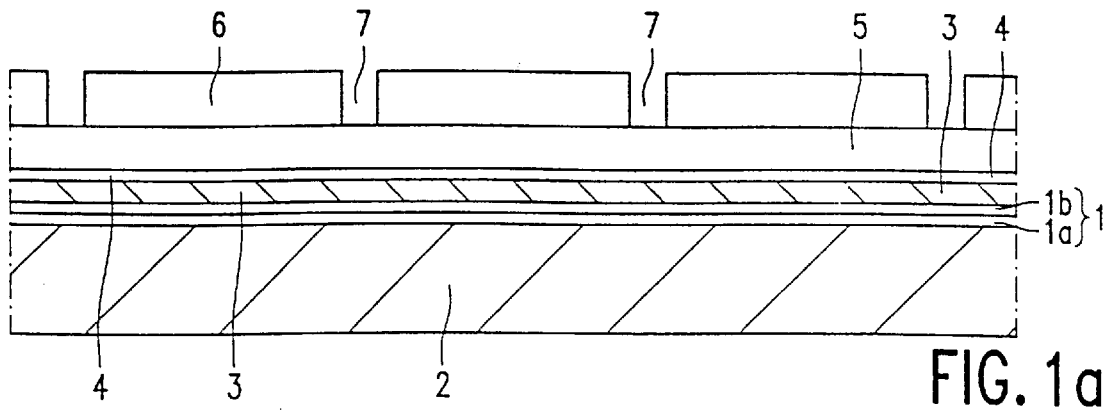
FIG. 1 is a cross-section of a semiconductor device manufactured by a method according to the invention in various stages of its manufacture.

It is noted that the drawing is diagrammatic and not true to scale. The invention is explained with reference to a charge coupled device, in particular an imaging device, in which it is of major importance that the electrodes should be at very small distances from one another. It is usual to provide the electrodes in a multilayer wiring in which adjoining electrodes overlap. Major advantages are obtained when the electrodes can be formed in a single poly layer, whereby process steps can be dispensed with and in addition a more planar structure can be obtained. It will become clear from the ensuing description that the invention has a much wider field of application than CCDs alone and, in general, may be applied wherever electrodes are to be provided at very small distances from one another on an electrically insulating substrate. In the present example, the insulating substrate is formed by a gate dielectric layer 1 provided on the surface of a silicon body 2 (FIG. 1a). The conductivity type and the doping concentration in the semiconductor body are such that CCD operation is possible in the body 2. The dielectric layer 1 may comprise a single layer of, for example, silicon oxide, but in the present example comprises a dual layer with a layer 1a of silicon oxide and a layer 1b of silicon nitride. The presence of the nitride layer 1b renders it possible inter alia to carry out oxidation steps without appreciably changing the gate dielectric 1. A doped polycrystalline silicon layer 3 (poly) in which the gates or electrodes of the charge coupled device are to be defined is provided on the dielectric layer 1. To limit absorption of light in the gates as much as possible, and thus to make the sensitivity of the imaging device as high as possible, the layer 3 is made very thin, i.e. thinner than approximately 0.1 $\mu$m. The thickness of the poly layer 3 is approximately 60 nm in the present example. A second silicon nitride layer, the layer 4, is provided on the poly layer 3 so as to form an oxidation mask for the poly layer 3. A comparatively thick ($\geq 0.5$ $\mu$m) oxide layer 5 is deposited on the nitride layer 4. A photoresist layer is provided thereon, and an etching mask 6 is formed in this photoresist in a usual manner, with openings 7 at the areas of the gaps to be formed between the gates. The width of the openings 7 is, for example, 0.5 $\mu$m. FIG. 1a shows this stage in the process.

Figure 1B:
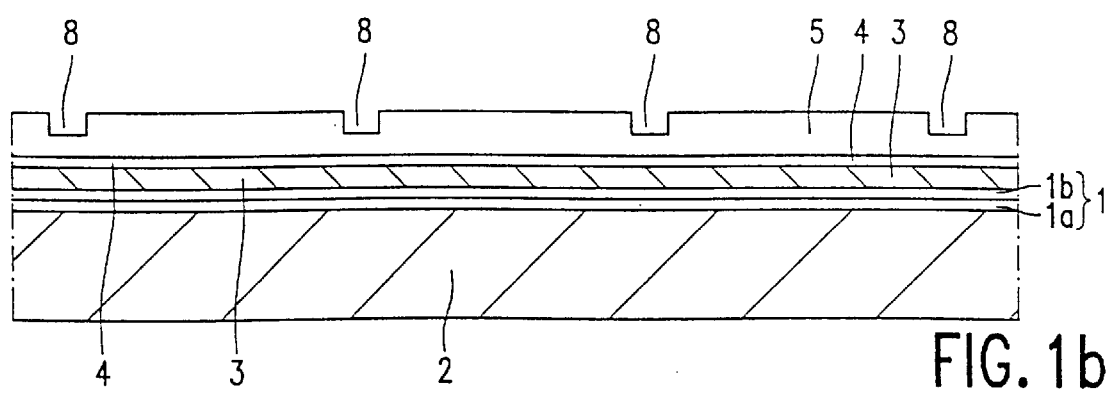

The pattern of openings 7 in the photoresist layer 6 is transferred to a first dielectric layer 4, 5 by means of anisotropic etching. In an extreme case, the openings can be provided right across the thickness of the oxide layer 5 down to the nitride layer. In the present example, however, the layer 5 is not etched throughout its entire thickness, but only through part of its thickness, for example through half or approximately half the layer 5 as shown in FIG. 1b. This Figure shows the device after the photoresist layer 6 has been removed subsequent to the etching of the oxide 5. The windows 8 in the oxide layer 5 have dimensions which correspond to those of the openings 7 in the mask 6 and are considerably greater, as will become apparent below, than those of the gaps to be formed in the conductive layer 3.

Figure 1C:
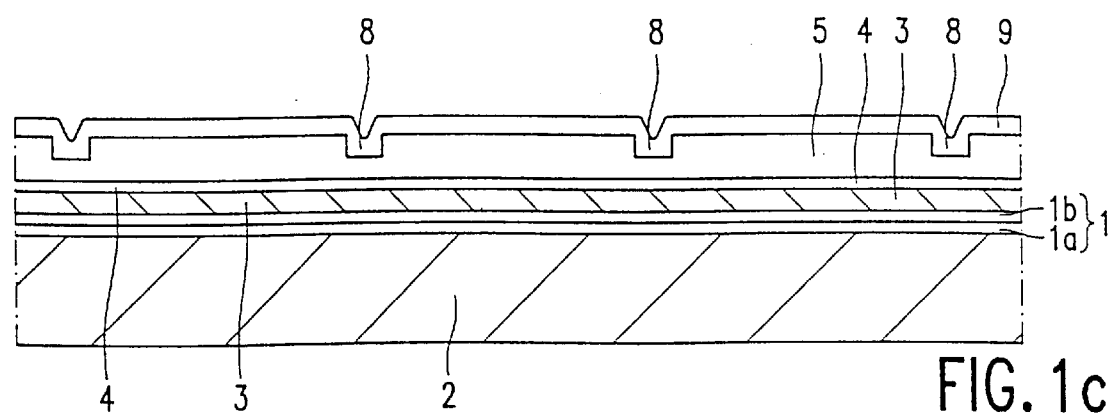
Figure 1D:
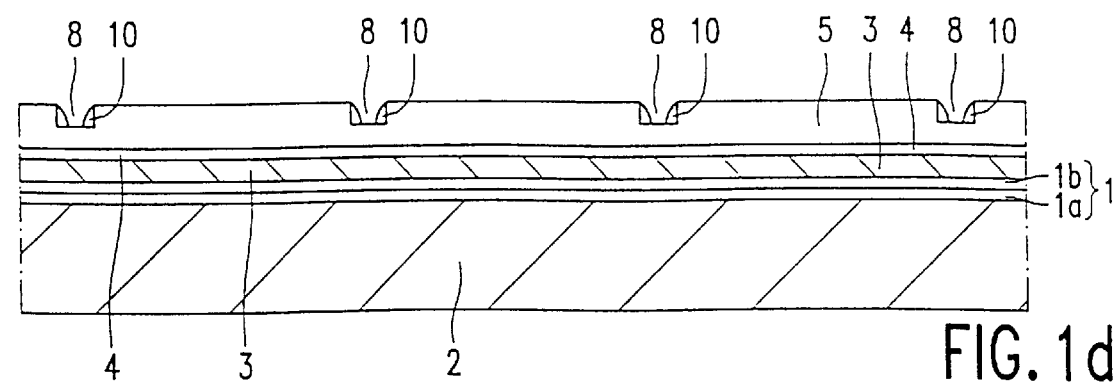
Figure 1E:
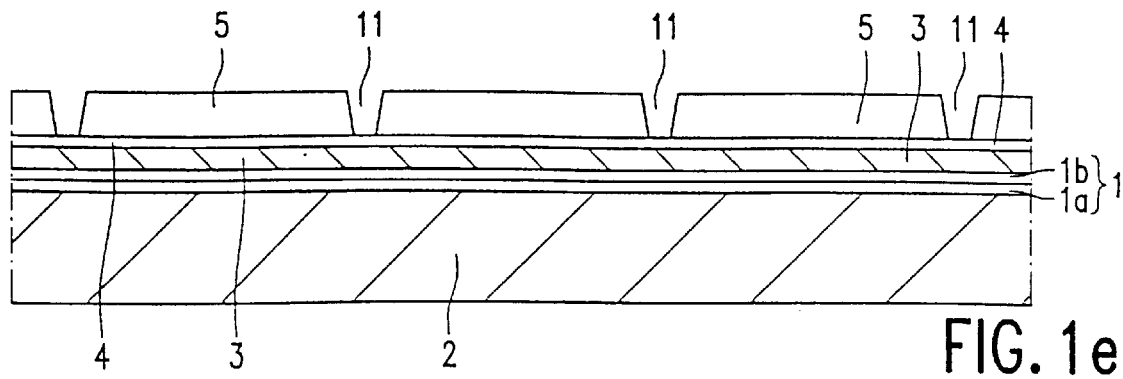
Figure 1F:
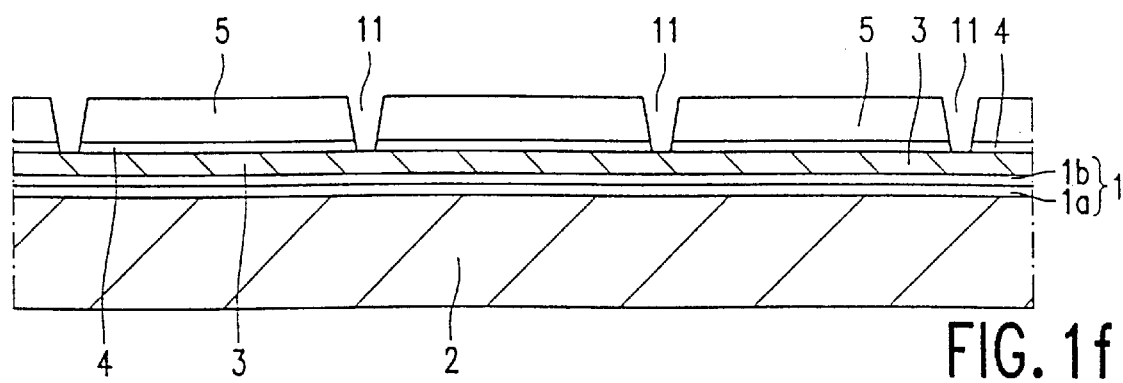
Figure 1G:
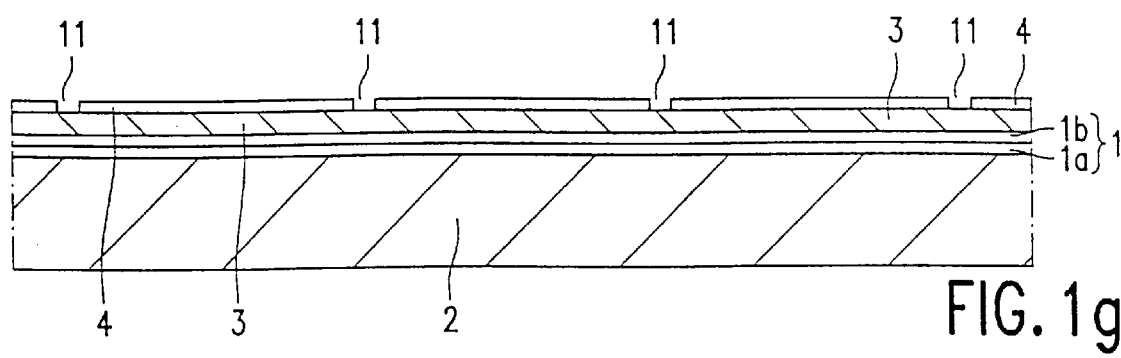
Figure 1H:
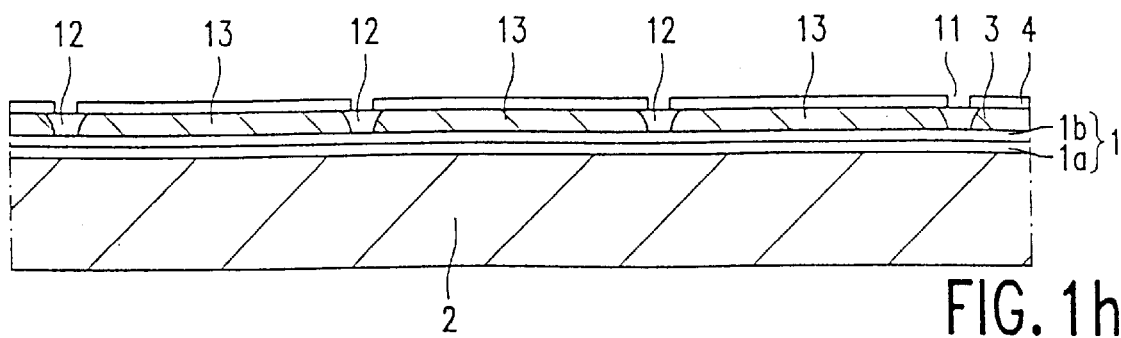

In a next stage shown in FIG. 1c, an additional oxide layer 9 is formed with a thickness of, for example, 0.25 $\mu$m, the pattern of windows 8 being present also in this additional layer. The layer 9 is subsequently removed again by means of anisotropic etching-back, such that, at the moment when the horizontal portions of the layer 9 have been removed, only portions 10 of the additional layer, referred to as spacers for short, remain on the side walls of the auxiliary windows 8 (FIG. 1d), strongly reducing the dimensions of the auxiliary windows 8. The etching treatment is continued (without mask) until the windows 11 (FIG. 1e) are obtained, which windows extend straight across the thickness of the remaining oxide layer 5 down to the nitride layer 4. As is shown in this Figure, the windows 11 have a tapering shape in downward direction, so that the width at the bottom of the windows 11 is considerably smaller than that at the top and is no more than approximately 0.2 $\mu$m. The etching treatment may be simply stopped the moment the poly layer 3 is reached. FIG. 1f shows the device in this stage of the process. The silicon oxide layer 5 can then be removed (FIG. 1g). The silicon nitride layer 4, provided with the very narrow windows 11, is used as a mask in the subsequent oxidation step in which the silicon of the poly layer 3 lying exposed in the windows 11 is converted into silicon oxide 12 by means of oxidation. The oxidized portions 12 extend through the entire thickness of the conductive layer 3 and define gates 13 in this layer which are mutually separated by the oxidized portions 12 (FIG. 1h). The oxidation step can be carried out such that short-circuits between adjoining gates 13 is prevented. To make the gaps between the gates 13 as small as possible, moreover, the oxidation is carried out in an oxidizing environment comprising water vapor. It has been found that under these circumstances the oxidation in lateral directions below the silicon nitride at the edges of the windows 11 is minimal, so that also the width of the oxide portions 12, and thus of the gaps between the electrodes 13, will be minimal. A possible explanation is that the presence of water vapor causes the formation of nitrogen-containing regions constituting a barrier against oxidation locally in the poly layer 3 at the boundary surfaces with the nitride layers 2 and 4. Since the poly layer is very thin, these nitrogen-containing regions can form a continuous oxidation barrier in the poly layer 3 close to the edges of the openings 11, preventing oxidation in lateral directions. In the present embodiment, where the thickness of the poly layer 3 is approximately 60 nm, the poly layer 3 can be oxidized through its entire thickness in a comparatively short period at a temperature of 1000° C. In an embodiment realized in practice, the width of the inter-electrode gaps was 0.2–0.25 $\mu$m, which is sufficiently small for achieving a satisfactory operation of the charge coupled device.

Figure 2A:
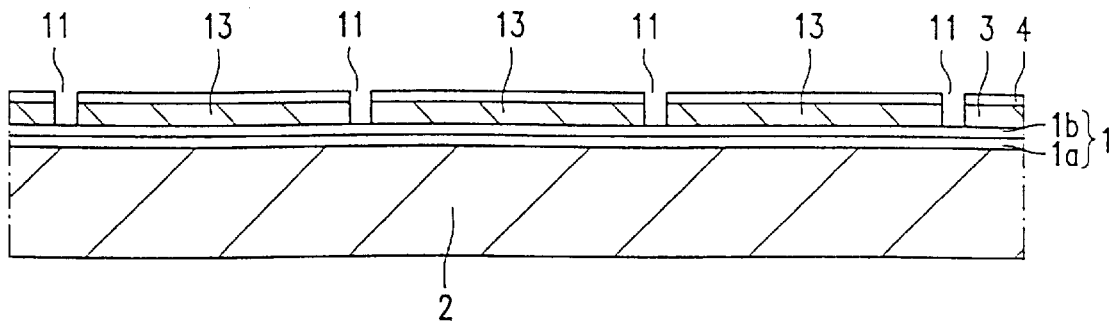
FIG. 2 is a cross-section of a semiconductor device manufactured by a modification of the above method in two stages of its manufacture.
Figure 2B:
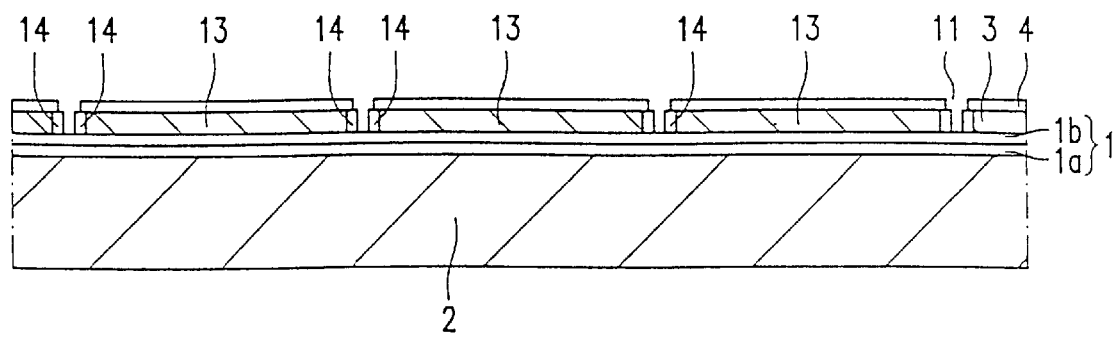

FIG. 2 shows a modification of the manufacturing process described above, starting with the situation of FIG. 1g, where the nitride layer 4 is provided with the narrow windows 11. Instead of an oxidation step, the poly layer 3 is now first subjected to an etching treatment whereby the openings 11 are formed also in the poly layer 3 right through the thickness of the poly layer. FIG. 2a shows this stage in the process. The electrodes 13 have already been formed in the poly layer 3 through the openings 11 at this stage. Then, see FIG. 2b, a light oxidation step is carried out. Any residues of conductor material between the gates 13 are converted into electrically insulating oxide by this oxidation step, so that short-circuits between gates are prevented. In addition, the lateral sides of the gates are covered with a thin oxide layer 14 during this oxidation step. In this embodiment, the width of the inter-electrode gaps is determined by the width of the windows 11 augmented by the widths of the oxidized edges of the electrodes. The total gap width may accordingly be slightly greater than in the preceding embodiment. On the other hand, this modification of the method is also suitable for use with greater thicknesses of the poly layer 3.

It will be obvious that the invention is not limited to the embodiments described here but that many more variations are possible to those skilled in the art within the scope of the invention. Thus, for example, the nitride-poly-nitride layer structure as used in the examples may also be used for manufacturing so-called MNOS memory elements, the letters M, N, O, and S denoting metal for the gate electrode (poly in the present case), nitride, oxide, and semiconductor material, respectively. In such elements, as is known, information is stored in the form of electric charge at the boundary surface between the nitride and the oxide. In a further modification of the embodiments described, the nitride layer 1b is not used. Furthermore, the invention may also be applied outside the field of integrated circuits, for example, if conductors are to be provided close together on a glass substrate or on a PCB.

What is claimed is:

1. A method of manufacturing conductor tracks on an electronic device, said method comprising:

providing an electrically insulating substrate;

providing a conductive layer on the substrate;

forming a conductor pattern on the conductive layer by forming windows at the conductor layer, the step of forming the windows at the conductor layer comprising:

providing a first dielectric layer adjacent the substrate and having a thickness;

forming auxiliary windows in the first dielectric layer having dimensions which are greater, in at least one dimension, than the windows to be formed at the conductor layer, the auxiliary windows having sidewalls which define a depth of the auxiliary windows which depth is only part of the thickness of the first dielectric layer;

providing an additional dielectric layer on the first dielectric layer including over the auxiliary windows formed in the first dielectric layer;

etching the additional dielectric layer back anisotropically without a mask to form spacers on the sidewalls of the auxiliary windows, which spacers are formed by unetched portions of the additional dielectric layer; and continuing etching anisotropically through the auxiliary window and the spacers to define the windows at the conductor layer.

2. A method as claimed in claim 1, characterized in that the conductive layer comprises silicon.

3. A method as claimed in claim 2, characterized in that the first dielectric layer is a dual layer comprising a sub-layer formed by a silicon nitride layer and a sub-layer of silicon oxide which is separated from the conductive layer by the silicon nitride layer.

4. A method as claimed in claim 3, characterized by:

providing a mask on the first dielectric layer having openings corresponding to the auxiliary windows to be formed, the mask comprising a mask layer of silicon oxide; and providing the silicon oxide sub-layer of the first dielectric layer to a thickness which is greater than the thickness of the mask layer of silicon oxide, whereupon said silicon oxide sub-layer is provided with said auxiliary windows.

5. A method as claimed in claim 4, characterized in that the conductor pattern is formed in the conductive layer in that the exposed portions of the conductive layer, exposed through the windows, are oxidized throughout their entire thickness.

6. A method as claimed in claim 5, characterized in that the oxidation is carried out in an oxidizing environment containing water vapor.

7. A method as claimed in claim 6, characterized in that the conductive layer is provided on a nitride layer on the substrate.

8. A method as claimed in claim 7, characterized in that the substrate is formed by a silicon body and an electrically insulating layer provided on the silicon body.

9. A method as claimed in claim 7, characterized in that a polycrystalline silicon layer with a thickness of at most 0.1 $\mu$m is used as the conductive layer.

10. A method as claimed in claim 8, characterized in that the conductor pattern is provided in the form of a number of conductor tracks which are situated next to one another, which extend mutually parallel over the electrically insulating layer, and which in co-operation with the subjacent silicon body constitute gate electrodes of a charge coupled device.

11. A method as claimed in claim 10, characterized in that a polycrystaline silicon layer with a thickness of at most 0.1 $\mu$m is used as the conductive layer.

* * * * *